United States Patent [19]

Shankar et al.

[11] Patent Number: 5,430,393
[45] Date of Patent: Jul. 4, 1995

[54] INTEGRATED CIRCUIT WITH A LOW-POWER MODE AND CLOCK AMPLIFIER CIRCUIT FOR SAME

[75] Inventors: Ravi Shankar; Kin K. Chau-Lee; Phil P. D. Hoang, all of Austin, Tex.

[73] Assignee: Motorola, Inc., Schaumburg, Ill.

[21] Appl. No.: 58,184

[22] Filed: May 10, 1993

[51] Int. Cl.⁶ .......................................... H03K 17/687
[52] U.S. Cl. .................................... 327/142; 327/281; 327/291; 327/437
[58] Field of Search ............... 307/576, 453, 451, 452, 307/272.1, 242, 445, 490, 500, 496, 269, 582, 585, 303.2, 304, 443; 377/80, 79, 74, 105, 106; 327/387, 391, 142, 261, 281, 437, 581, 379, 291

[56] References Cited

U.S. PATENT DOCUMENTS

| | | | |
|---|---|---|---|
| 4,212,083 | 7/1980 | Rao | 365/154 |
| 4,377,819 | 3/1983 | Saki et al. | 357/59 |
| 4,758,945 | 7/1988 | Remedi | 364/200 |
| 4,885,544 | 12/1989 | Tago | 307/585 |
| 4,890,270 | 12/1989 | Griffith | 377/20 |
| 4,899,071 | 2/1990 | Morales | 307/605 |
| 4,922,141 | 5/1990 | Lofgren et al. | 307/595 |
| 4,953,187 | 8/1990 | Herold et al. | 377/117 |
| 5,073,726 | 12/1991 | Kato et al. | 307/443 |
| 5,115,150 | 5/1992 | Ludwig | 307/475 |
| 5,151,613 | 9/1992 | Satou et al. | 307/243 |
| 5,200,907 | 4/1993 | Tran | 307/576 |
| 5,208,489 | 5/1993 | Houston | 307/451 |
| 5,220,216 | 6/1993 | Woo | 307/451 |
| 5,231,319 | 7/1993 | Crafts et al. | 307/603 |

OTHER PUBLICATIONS

Millman, Jacob and Halkias, Christos C., "Integrated Electronics", McGraw Hill, Inc., New York, 1972, pp. 542–543.

*Primary Examiner*—Timothy P. Callahan
*Assistant Examiner*—My-Trang Nu Ton
*Attorney, Agent, or Firm*—Paul J. Polansky

[57] ABSTRACT

An integrated circuit (40) has a low-power mode in which at least one switched inverter stage (60) of a clock amplifier (41) is disabled in response to a stop signal. The stop signal indicates that the integrated circuit (40) is in low-power mode. In one embodiment, each switched inverter stage is a complementary metal-oxide-semiconductor (CMOS) switched inverter (60), in which an additional P-channel transistor (61) is connected between the source of an inverter P-channel transistor (62) and a positive power supply voltage terminal, and in which an additional N-channel transistor (64) is connected between a source of an inverter N-channel transistor (63) and a negative power supply voltage terminal. A non-switched inverter stage (52) remains active during low-power mode to maintain a DC value of a clock input signal near a switchpoint of the clock amplifier (41).

20 Claims, 2 Drawing Sheets

INTEGRATED CIRCUIT WITH A LOW-POWER MODE AND CLOCK AMPLIFIER CIRCUIT FOR SAME

FIELD OF THE INVENTION

This invention relates generally to electronic circuits, and more particularly, to integrated circuits with a low-power mode and clock amplifier circuits for such integrated circuits.

BACKGROUND OF THE INVENTION

Many integrated circuits require an external clock signal to control sequential logic, switched-capacitor filters, or the like. The clock signal must be amplified and buffered on-chip in order to drive a large number of clocked circuits. In some very-large-scale integration (VLSI) devices it is necessary to minimize high-frequency interference caused by harmonics contained in a square wave input clock signal. For these devices, the input clock signal is preferably a sinusoidal signal of relatively small amplitude, such as one volt peak-to-peak, which is alternating current- (AC-) coupled through a capacitor to a clock amplifier. The clock amplifier typically includes an inverter which is self-biased to keep the direct current (DC) voltage on the input node near the switchpoint of the inverter.

An important feature for integrated circuits is to be able to operate in a low-power or "sleep" mode. In the low-power mode, most circuitry is disabled to save power and this circuitry does not need to be clocked. Upon re-entering normal operation, this circuitry again needs a clock signal for proper operation. It is desirable for the integrated circuit to disable as much circuitry as possible during low-power mode and to recover quickly from low-power mode. These performance requirements create a tradeoff for the clock amplifier. If the clock amplifier is disabled during low-power mode, then the coupling capacitor may discharge and the output of the clock amplifier will not switch while the coupling capacitor is recharging. However, the amplifier is always biased near its switchpoint during operation, resulting in a significant DC current. Thus, if the clock amplifier remains enabled during low-power mode, power consumption increases. A clock amplifier circuit which avoids these tradeoffs is needed.

SUMMARY OF THE INVENTION

Accordingly, there is provided, in one form, an integrated circuit with a low-power mode, comprising an inverter portion, a resistor, a logic portion, and an internal circuit. The inverter portion receives a clock signal and a stop signal, and provides an output signal on an output terminal thereof in response to the clock signal. The inverter portion includes a switched inverter and a constant inverter. The switched inverter receives the clock signal and the stop signal, and provides a first voltage at the output terminal of the inverter portion responsive to the clock signal when the stop signal is inactive. The constant inverter receives the clock signal and provides a second voltage at the output terminal of the inverter responsive to the clock signal and independent of the stop signal. The resistor has a first terminal for receiving the clock signal, and a second terminal coupled to the output terminal of the inverter. The logic portion is coupled to the inverter portion, and provides a clock output signal in response to the output signal of the inverter portion, when the stop signal is inactive. The internal circuit has a clock input terminal for receiving the clock output signal.

In another form, there is provided a clock amplifier circuit comprising at least one switched inverter stage, an inverter, a resistor, and a logic portion. Each switched inverter stage has an input terminal for receiving a clock signal, a control input terminal for receiving a stop signal, and an output terminal connected to an output node. The inverter has an input terminal for receiving the clock signal, and an output terminal coupled to the output node. The resistor has a first terminal coupled to the input terminals of each switched inverter stage and to the input terminal of the inverter, and a second terminal coupled to the output node. The logic portion is coupled to each switched inverter stage and to the inverter, and provides a clock output signal in response to a voltage on the output node, when the stop signal is inactive.

These and other features and advantages will be more clearly understood from the following detailed description taken in conjunction with the accompanying drawings.

DETAILED DESCRIPTION OF A PREFERRED EMBODIMENT

Figure 1:
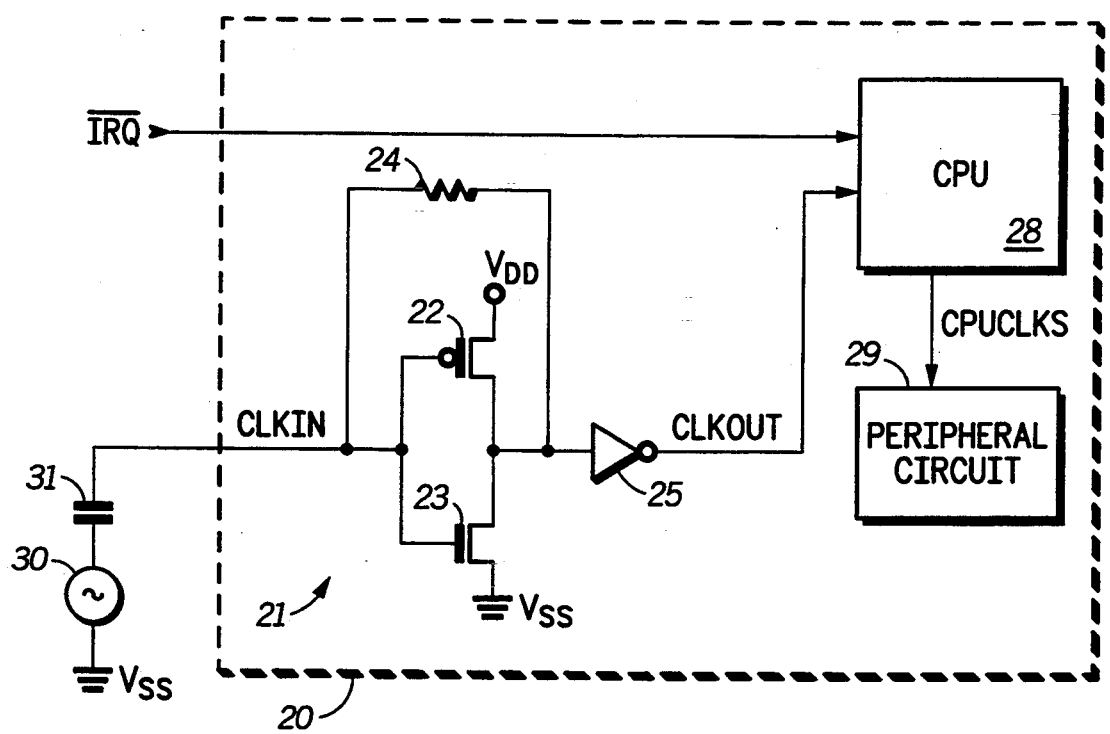
FIG. 1 illustrates in partial schematic and partial block diagram form an integrated circuit in accordance with the prior art.

FIG. 1 illustrates in partial schematic and partial block diagram form an integrated circuit 20 in accordance with the prior art. Integrated circuit 20 includes a conventional clock amplifier circuit 21 which receives a clock signal labelled "CLKIN" and provides a buffered clock signal labelled "CLKOUT" to a central processing unit (CPU) 28 and a peripheral circuit 29 in response. Clock amplifier circuit 21 includes a P-channel metal-oxide-semiconductor (MOS) transistor 22, an N-channel MOS transistor 23, a resistor 24, and an inverter 25. Transistor 22 has a source connected to a power supply voltage terminal labelled "$V_{DD}$", a gate for receiving signal CLKIN, and a drain. $V_{DD}$ is a more-positive power supply voltage terminal providing a voltage having a typical value of approximately five volts. Transistor 23 has a drain connected to the drain of transistor 22, a gate for receiving signal CLKIN, and a source connected to a power supply voltage terminal labelled "$V_{SS}$". $V_{SS}$ is a more-negative power supply voltage terminal providing a voltage having a typical value of approximately zero volts. Resistor 24 has a first terminal for receiving signal CLKIN, and a second terminal connected to the drains of transistors 22 and 23. Inverter 25 has an input terminal connected to the drains of transistors 22 and 23, and an output terminal for providing signal CLKOUT.

CPU 28 has inputs for receiving an active-low interrupt request signal labelled "$\overline{IRQ}$" and signal CLKOUT, and an output terminal for providing clock signals labelled "CPUCLKS". Peripheral circuit 29 has an input for receiving the CPUCLKS, and is any conventional circuit which uses clocked or sequential logic, such as an input/output peripheral, switched capacitor filter, digital-to-analog converter (DAC) or analog-to-digital converter (ADC) using a sigma delta modulator, or the like. CPU 28 executes instructions from memory (not shown), which may be either internal or external to integrated circuit 20. In response to a stop instruction, CPU 28 goes into a low-power or sleep mode, in which power consumption is reduced. In order to reduce power consumption in peripheral circuit 29, CPU 28 keeps the CPUCLKS from changing logic state; peripheral circuit 29 goes into a low-power because internal sequential logic circuitry is not being clocked, and thus consumes very little power. CPU 28 itself also enters low-power mode, in which an internal clock generator (not shown) is inactivated, thus preventing its own sequential logic from switching. CPU 28 exits low-power mode, and again drives CPUCLKS, upon an activation of signal $\overline{IRQ}$. CPU 28 includes combinational logic responsive to signal $\overline{IRQ}$ for this purpose.

Also shown in FIG. 1 is a voltage source 30 and a capacitor 31. Voltage source 30 has a first terminal, and a second terminal connected to $V_{SS}$, and provides a one volt peak-to-peak sinusoidal voltage between the first terminal thereof and $V_{SS}$. Capacitor 31 has a first terminal connected to the first terminal of voltage source 30, and a second terminal for providing signal CLKIN. Thus, voltage source 30 is AC-coupled to clock amplifier 21. Transistors 22 and 23 and resistor 24 together set the DC value of CLKIN. Resistor 24 is a relatively high-valued resistor.

Transistors 22 and 23 amplify a small signal, such as 1 volt peak-to-peak. It is desirable to adjust the gain of inverter 21 such that the output levels are within one threshold drop of $V_{DD}$ and $V_{SS}$, to save power in inverter 25. Inverter 25 then subsequently increases the logic levels to full-supply. For transistors 22 and 23 to provide enough gain, they must be sized to conduct a large current during switching. In addition, transistors 22 and 23 and resistor 24 set the DC voltage at the gates of transistors 22 and 23 to approximately mid-supply; this voltage is approximately the switchpoint of the inverter formed by transistors 22 and 23. Both transistors 22 and 23 are biased near their threshold voltages, and both transistors are always somewhat conductive. Clock amplifier circuit 21 in fact consumes as much power during low-power mode as during normal operation.

Alternatively, clock amplifier circuit 21 could be disabled during low-power mode. However, the DC value of signal CLKIN tends to drift during low-power mode due to leakage in capacitor 31. At the end of low-power mode, the DC value may be so high or so low that the 1 volt peak-to-peak AC component of CLKIN is not sufficient to switch the inverter formed by transistors 22 and 23. The length of time required to re-charge capacitor 31 to its correct DC value depends on an RC time constant formed by resistor 24 and capacitor 31. Thus, it may take many cycles after the termination of low-power mode before CLKOUT begins to switch, and many more cycles before CLKOUT achieves approximately a fifty percent duty cycle and thus becomes usable, causing a degradation in performance.

Figure 2:
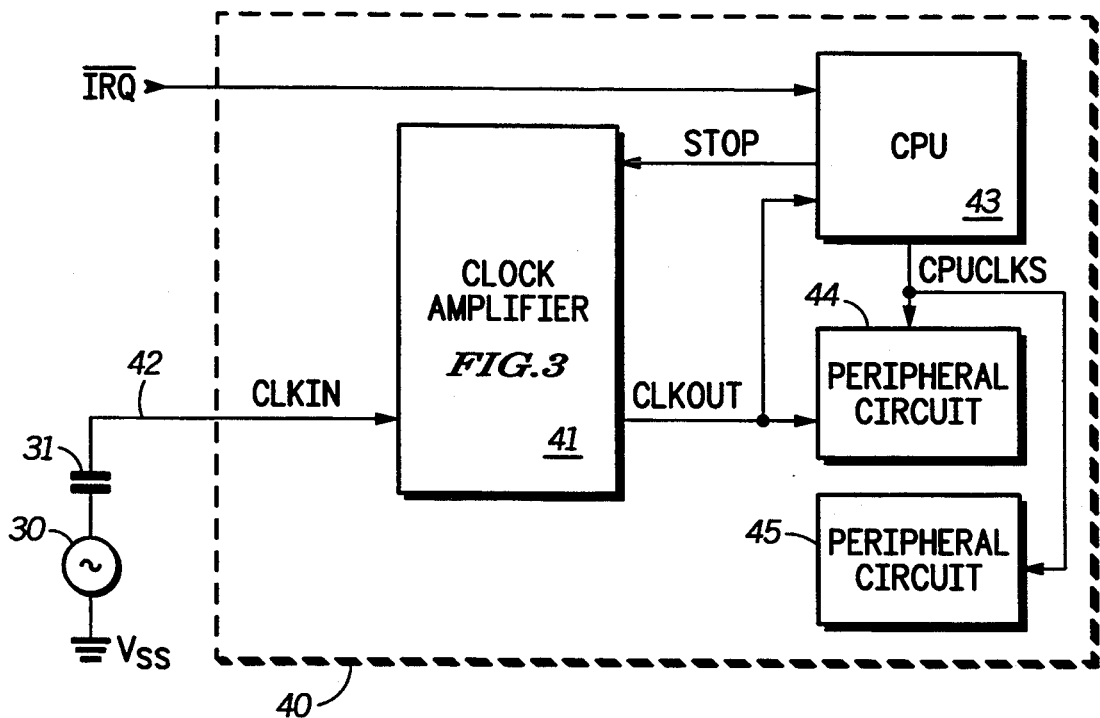
FIG. 2 illustrates in block diagram form an integrated circuit in accordance with the present invention.

FIG. 2 illustrates in block diagram form an integrated circuit 40 in accordance with the present invention. Elements in common with FIG. 1 retain their previous reference numbers. As with integrated circuit 20 of FIG. 1, integrated circuit 40 receives sinusoidal clock signal CLKIN provided by oscillator 30 and capacitor 31 to an input node 42, and signal $\overline{IRQ}$. In the illustrated embodiment, input node 42 is an integrated circuit bonding pad which receives signal CLKIN through a bonding wire and a lead frame (not shown). Integrated circuit 40 includes a clock amplifier circuit 41, a CPU 43, and peripheral circuits 44 and 45.

In integrated circuit 40, clock amplifier 41 receives not only signal CLKIN but also a stop signal labelled "STOP" from CPU 43. When signal STOP is active, clock amplifier circuit 41 disables most of its multiple inverter stages so that current consumption is greatly reduced, but keeps one inverter stage active. The result is that integrated circuit 40 reduces power consumption during low-power mode over integrated circuit 20 of FIG. 1 while providing signal CLKOUT immediately after the end of low-power mode.

CPU 43 has an input for receiving signal CLKOUT from clock amplifier 41, an input for receiving signal $\overline{IRQ}$, an output for providing signal STOP, and an output port for providing several clock signals labelled "CPUCLKS". CPU 43 has an internal clock generator circuit (not shown) which receives signal CLKOUT and provides signals CPUCLKS in response. CPUCLKS may be any desirable set of clock signals useful for the operation of CPU 43 and peripheral circuits 44 and 45, such as four non-overlapping clock signals generated from a two-cycle period of signal CLKOUT. In response to a stop instruction, CPU 43 goes into a low-power or sleep mode, in which power consumption is reduced. In order to reduce power consumption in peripheral circuits 44 and 45, CPU 43 keeps the CPUCLKS from changing logic state by gating signal CLKOUT by an internal low-power mode signal (not shown). CPU 43 exits low-power mode, and again drives CPUCLKS, upon an activation of signal $\overline{IRQ}$. CPU 43 includes combinational logic responsive to signal $\overline{IRQ}$ for this purpose.

Peripheral circuit 44 is a coder-decoder (codec), including a sigma-delta analog-to-digital converter (ADC) and sigma-delta digital-to-analog converter (DAC), but may be any other conventional clocked peripheral. Peripheral 44 receives both signal CLKOUT and CPUCLKS to perform data conversion synchronized to the operation of CPU 43. During low-power mode, since neither CLKOUT nor CPUCLKS changes logic state, the complementary metal-oxide-semiconductor (CMOS) circuitry in peripheral circuit 44 consumes a minimum of power. Peripheral circuit 45 is a serial interface port, and operates in response to CPUCLKS but does not receive signal CLKOUT. Peripheral circuit 45 operates with low power when CPU 43 prevents CPUCLKS from switching. Note that the mechanism used to place a CPU or a peripheral in low-power mode varies from application to application, and many other mechanisms besides those shown may be used.

Figure 3:
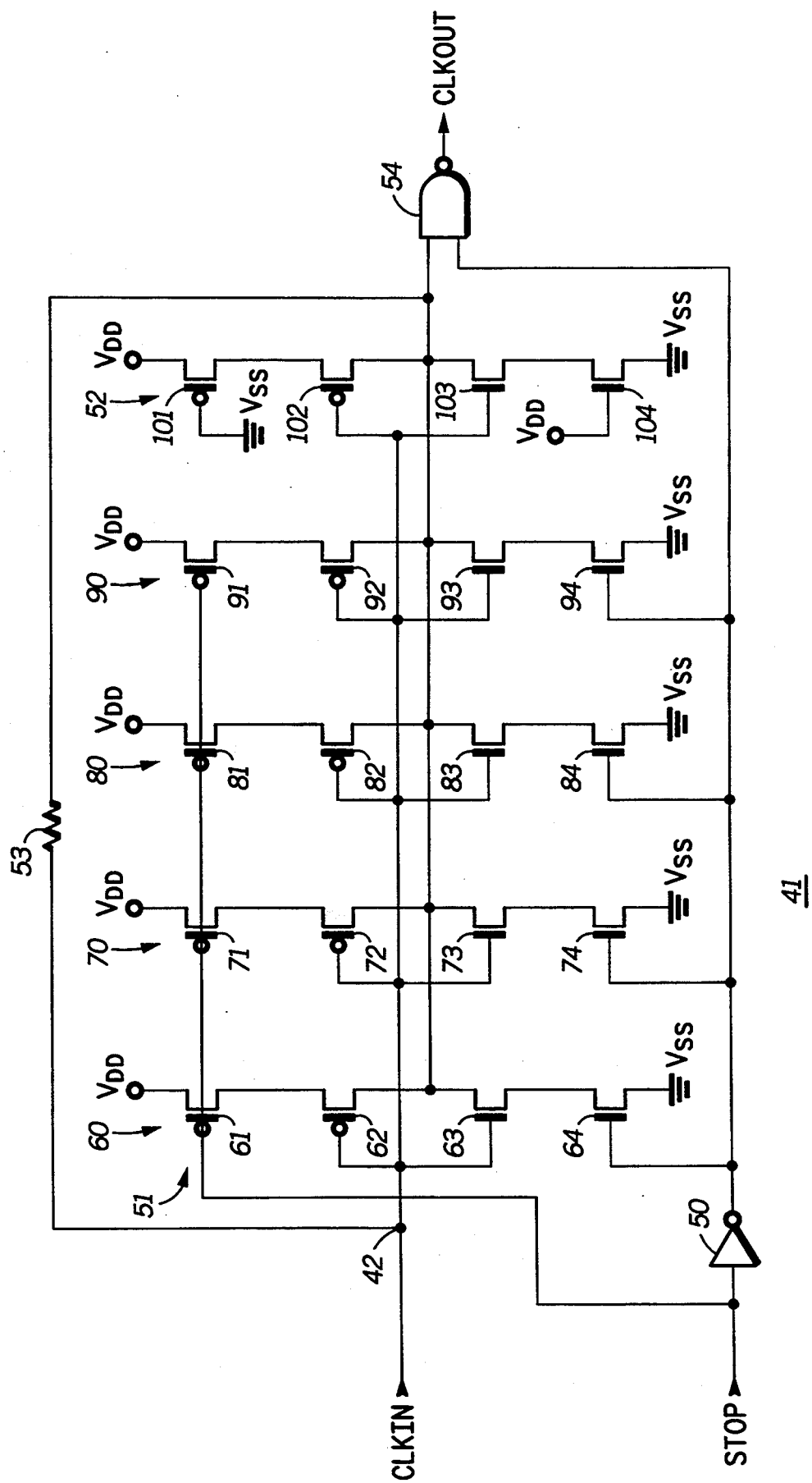
FIG. 3 illustrates in partial schematic and partial logic diagram form the clock amplifier of FIG. 2.

FIG. 3 illustrates in partial schematic and partial logic diagram form clock amplifier 41 of FIG. 2. Clock amplifier 41 includes generally an inverter 50, a switched inverter 51, a constant inverter 52, a resistor 53, and a NAND gate 54. Clock amplifier 41 receives signal STOP, and signal CLKIN on input node 42. Inverter 50 has an input terminal for receiving signal STOP, and an output terminal. Switched inverter 51 has an input terminal connected to node 42 for receiving signal CLKIN thereon, and an output terminal. Constant inverter 52 has an input terminal connected to node 42 for receiving signal CLKIN thereon, and an output terminal connected to the output terminal of switched inverter 51. Resistor 53 has a first terminal connected to node 42, and a second terminal connected to the output terminals of switched inverter 51 and constant inverter 52. NAND gate 54 has a first input terminal connected to the output terminals of switched inverter 51 and constant inverter 52, a second input terminal connected to the output terminal of inverter 50, and an output terminal for providing signal CLKOUT.

More specifically, switched inverter 51 includes four switched inverter stages 60, 70, 80, and 90. Switched inverter stage 60 includes P-channel transistors 61 and 62, and N-channel transistors 63 and 64. Transistor 61 has a source connected to $V_{DD}$, a gate for receiving signal STOP, and a drain. Transistor 62 has a source connected to the drain of transistor 61, a gate connected to node 42 for receiving signal CLKIN, and a drain connected to the first input terminal of NAND gate 54. Transistor 63 has a drain connected to the drain of transistor 62, a gate connected to node 42 for receiving signal CLKIN, and a source. Transistor 64 has a drain connected to the source of transistor 63, a gate connected to the output terminal of inverter 50, and a source connected to $V_{SS}$.

Switched inverter stage 70 includes P-channel transistors 71 and 72, and N-channel transistors 73 and 74. Transistor 71 has a source connected to $V_{DD}$, a gate for receiving signal STOP, and a drain. Transistor 72 has a source connected to the drain of transistor 71, a gate connected to node 42 for receiving signal CLKIN, and a drain connected to the first input terminal of NAND gate 54. Transistor 73 has a drain connected to the drain of transistor 72, a gate connected to node 42 for receiving signal CLKIN, and a source. Transistor 74 has a drain connected to the source of transistor 73, a gate connected to the output terminal of inverter 50, and a source connected to $V_{SS}$.

Switched inverter stage 80 includes P-channel transistors 81 and 82, and N-channel transistors 83 and 84. Transistor 81 has a source connected to $V_{DD}$, a gate for receiving signal STOP, and a drain. Transistor 82 has a source connected to the drain of transistor 81, a gate connected to node 42 for receiving signal CLKIN, and a drain connected to the first input terminal of NAND gate 54. Transistor 83 has a drain connected to the drain of transistor 82, a gate connected to node 42 for receiving signal CLKIN, and a source. Transistor 84 has a drain connected to the source of transistor 83, a gate connected to the output terminal of inverter 50, and a source connected to $V_{SS}$.

Switched inverter stage 90 includes P-channel transistors 91 and 92, and N-channel transistors 93 and 94. Transistor 91 has a source connected to $V_{DD}$, a gate for receiving signal STOP, and a drain. Transistor 92 has a source connected to the drain of transistor 91, a gate connected to node 42 for receiving signal CLKIN, and a drain connected to the first input terminal of NAND gate 54. Transistor 93 has a drain connected to the drain of transistor 92, a gate connected to node 42 for receiving signal CLKIN, and a source. Transistor 94 has a drain connected to the source of transistor 93, a gate connected to the output terminal of inverter 50, and a source connected to $V_{SS}$.

Constant inverter stage 52 includes P-channel transistors 101 and 102, and N-channel transistors 103 and 104. Transistor 101 has a source connected to $V_{DD}$, a gate connected to $V_{SS}$, and a drain. Transistor 102 has a source connected to the drain of transistor 101, a gate connected to node 42 for receiving signal CLKIN, and a drain connected to the first input terminal of NAND gate 54. Transistor 103 has a drain connected to the drain of transistor 102, a gate connected to node 42 for receiving signal CLKIN, and a source. Transistor 104 has a drain connected to the source of transistor 63, a gate connected to $V_{DD}$, and a source connected to $V_{SS}$.

Switched inverter stages 60, 70, 80, and 90 of clock amplifier 41 are disabled during low-power mode by isolating the sources of inverter switching transistors from their respective power supply potentials. For example, during low-power mode transistor 61 is nonconductive, causing the source of transistor 62 to be isolated from $V_{DD}$. However, constant inverter 52 is always active, and thus keeps the DC value at node 42 at the switchpoint of switched inverter 51 and constant inverter 52.

It is preferable to match the ratio of the equivalent P-channel gate width-to-gate length (W/L) and the equivalent N-channel W/L in constant inverter 52, to the ratio of the equivalent P-channel W/L and the equivalent N-channel W/L of the stages of switched inverter 51. For example, the gate size of transistor 101 is matched to the gate sizes of transistors 61, 71, 81, and 91. In this way, constant inverter 52 is able to keep the same DC level on node 42 during low-power mode as during normal operation. The DC value at node 42 (and the switchpoint of switched inverter 51 and constant inverter 52) is set to halfway between $V_{DD}$ and $V_{SS}$ or approximately 2.5 volts. Typical values for the components are 80 kilohms for resistor 53; 1 nanofarad for capacitor 31 of FIG. 2; W/L of: 14/4 for transistors 61, 71, 81, 91, and 101; 12/6 for transistors 62, 72, 82, 92, and 102; 5/6 for transistors 63, 73, 83, 93, and 103; and 6/4 for transistors 64, 74, 84, 94, and 104. However, these sizes may vary as design and manufacturing processes vary. It should also be apparent that the number of switched inverter stages will vary in different embodiments; at a minimum, one switched inverter stage and one constant inverter stage are required.

While the invention has been described in the context of a preferred embodiment, it will be apparent to those skilled in the art that the present invention may be modified in numerous ways and may assume many embodiments other than that specifically set out and described above. For example, a clock amplifier according to the present invention may include a switched inverter having more or less than four switched inverter stages. Also the stop signal may be provided from a source external to the integrated circuit rather than by an on-chip CPU. Accordingly, it is intended by the appended claims to cover all modifications of the invention which fall within the true spirit and scope of the invention.

We claim:

1. An integrated circuit with a low-power mode, comprising:
   inverter means for receiving a clock signal and a stop signal, and for providing an output signal on an output terminal thereof in response to said clock signal, said inverter means including a switched inverter means and a constant inverter means;
   said switched inverter means for receiving said clock signal and said stop signal, and for providing a first voltage at said output terminal of said inverter means responsive to said clock signal when said stop signal is inactive;
   said constant inverter means for receiving said clock signal and for providing a second voltage at said output terminal of said inverter means responsive to said clock signal and independent of said stop signal;

a resistor having a first terminal for receiving said clock signal, and a second terminal coupled to said output terminal of said inverter means;

logic means coupled to said inverter means, for providing a clock output signal in response to said output signal of said inverter means, when said stop signal is inactive; and an internal circuit having a clock input terminal for receiving said clock output signal, and an output terminal for providing said stop signal to indicate that the integrated circuit is in the low power mode.

2. The integrated circuit of claim 1, wherein said switched inverter means comprises at least one switched inverter stage.

3. The integrated circuit of claim 2, wherein each of said at least one switched inverter stage comprises:

a first transistor having a first current electrode coupled to a first power supply voltage terminal, a control electrode for receiving said stop signal, and a second current electrode;

a second transistor having a first current electrode coupled to said second current electrode of said first transistor, a control electrode for receiving said clock signal, and a second current electrode coupled to said output terminal of said inverter means;

a third transistor having a first current electrode coupled to said second current electrode of said second transistor, a control electrode for receiving said clock signal, and a second current electrode; and a fourth transistor having a first current electrode coupled to said second current electrode of said third transistor, a control electrode for receiving a complement of said stop signal, and a second current electrode coupled to a second power supply voltage terminal.

4. The integrated circuit of claim 3 wherein said first and second transistors are P-channel transistors, and wherein said third and fourth transistors are N-channel transistors.

5. The integrated circuit of claim 1 wherein said constant inverter means comprises:

a fifth transistor having a first current electrode coupled to a first power supply voltage terminal, a control electrode coupled to a second power supply voltage terminal, and a second current electrode;

a sixth transistor having a first current electrode coupled to said second current electrode of said fifth transistor, a control electrode for receiving said clock signal, and a second current electrode coupled to said output terminal of said inverter means;

a seventh transistor having a first current electrode coupled to said second current electrode of said sixth transistor, a control electrode for receiving said dock signal, and a second current electrode; and an eighth transistor having a first current electrode coupled to said second current electrode of said seventh transistor, a control electrode coupled to said first power supply voltage terminal, and a second current electrode coupled to said second power supply voltage terminal.

6. The integrated circuit of claim 5 wherein said fifth and sixth transistors are P-channel transistors, and wherein said seventh and eighth transistors are N-channel transistors.

7. The integrated circuit of claim 1 wherein said logic means comprises a NAND gate having a first input terminal coupled to said output terminal of said inverter means, a second input terminal for receiving a complement of said stop signal, and an output terminal for providing said clock output signal.

8. The integrated circuit of claim 1 wherein said internal circuit comprises a central processing unit, and wherein said central processing unit provides said stop signal in response to a stop instruction.

9. An integrated circuit with a low-power mode, comprising:

at least one switched inverter stage each having an input terminal for receiving a clock signal, a control input terminal for receiving a stop signal, and an output terminal connected to an output node;

an inverter having an input terminal for receiving said clock signal, and an output terminal coupled to said output node;

a resistor having a first terminal coupled to said input terminal of each switched inverter stage of said at least one switched inverter stage and to said input terminal of said inverter, and a second terminal coupled to said output node;

logic means coupled to each switched inverter stage and to said inverter, for providing a clock output signal in response to said a voltage on said output node, when said stop signal is inactive; and an internal circuit having a clock input terminal for receiving said clock output signal, and an output terminal for providing said stop signal to indicate that the integrated circuit is in the low power mode.

10. The integrated circuit of claim 9, wherein each switched inverter stage comprises:

a first transistor having a first current electrode coupled to a first power supply voltage terminal, a control electrode for receiving said stop signal, and a second current electrode;

a second transistor having a first current electrode coupled to said second current electrode of said first transistor, a control electrode for receiving said clock signal, and a second current electrode coupled to said output terminal of said at least one switched inverter stage;

a third transistor having a first current electrode coupled to said second current electrode of said second transistor, a control electrode for receiving said clock signal, and a second current electrode; and a fourth transistor having a first current electrode coupled to said second current electrode of said third transistor, a control electrode for receiving a complement of said stop signal, and a second current electrode coupled to a second power supply voltage terminal.

11. The integrated circuit of claim 10 wherein said first and second transistors are P-channel transistors, and wherein said third and fourth transistors are N-channel transistors.

12. The integrated circuit of claim 9 wherein said inverter comprises:

a fifth transistor having a first current electrode coupled to a first power supply voltage terminal, a control electrode coupled to a second power supply voltage terminal, and a second current electrode;

a sixth transistor having a first current electrode coupled to said second current electrode of said fifth transistor, a control electrode for receiving said clock signal, and a second current electrode coupled to said output terminal of said inverter;

a seventh transistor having a first current electrode coupled to said second current electrode of said sixth transistor, a control electrode for receiving said clock signal, and a second current electrode; and an eighth transistor having a first current electrode coupled to said second current electrode of said seventh transistor, a control electrode coupled to said first power supply voltage terminal, and a second current electrode coupled to said second power supply voltage terminal.

13. The integrated circuit of claim 12 wherein said fifth and sixth transistors are P-channel transistors, and wherein said seventh and eighth transistors are N-channel transistors.

14. The integrated circuit of claim 9 wherein said logic means comprises a NAND gate having a first input terminal coupled to said output terminal of said at least one switched inverter stage, a second input terminal for receiving a complement of said stop signal, and an output terminal for providing said clock output signal.

15. The integrated circuit of claim 9 wherein said internal circuit comprises a central processing unit, and wherein said central processing unit provides said stop signal in response to a stop instruction.

16. A clock amplifier circuit, comprising:
at least one switched inverter stage each having an input terminal for receiving a clock signal, a control input terminal for receiving a stop signal, and an output terminal connected to an output node;
an inverter having an input terminal for receiving said clock signal, and an output terminal coupled to said output node;
a resistor having a first terminal coupled to said input terminal of each switched inverter stage of said at least one switched inverter stage and to said input terminal of said inverter, and a second terminal coupled to said output node; and
logic means coupled to each switched inverter stage and to said inverter, for providing a clock output signal in response to said a voltage on said output node, when said stop signal is inactive;
wherein said inverter comprises:
a fifth transistor having a first current electrode coupled to a first power supply voltage terminal, a control electrode coupled to a second power supply voltage terminal, and a second current electrode;

a sixth transistor having a first current electrode coupled to said second current electrode of said fifth transistor, a control electrode for receiving said clock signal, and a second current electrode coupled to said output terminal of said inverter;

a seventh transistor having a first current electrode coupled to said second current electrode of said sixth transistor, a control electrode for receiving said clock signal, and a second current electrode; and an eighth transistor having a first current electrode coupled to said second current electrode of said seventh transistor, a control electrode coupled to said first power supply voltage terminal, and a second current electrode coupled to said second power supply voltage terminal.

17. The clock amplifier circuit of claim 16, wherein each inverter stage comprises:
a first transistor having a first current electrode coupled to a first power supply voltage terminal, a control electrode for receiving said stop signal, and a second current electrode;
a second transistor having a first current electrode coupled to said second current electrode of said first transistor, a control electrode for receiving said clock signal, and a second current electrode coupled to said output terminal of said at least one switched inverter stage;
a third transistor having a first current electrode coupled to said second current electrode of said second transistor, a control electrode for receiving said clock signal, and a second current electrode; and
a fourth transistor having a first current electrode coupled to said second current electrode of said third transistor, a control electrode for receiving a complement of said stop signal, and a second current electrode coupled to a second power supply voltage terminal.

18. The clock amplifier circuit of claim 17 wherein said first and second transistors are P-channel transistors, and wherein said third and fourth transistors are N-channel transistors.

19. The clock amplifier circuit of claim 16 wherein said fifth and sixth transistors are P-channel transistors, and wherein said seventh and eighth transistors are N-channel transistors.

20. The clock amplifier circuit of claim 16 wherein said logic means comprises a NAND gate having a first input terminal coupled to said output terminal of said at least one switched inverter stage, a second input terminal for receiving a complement of said stop signal, and an output terminal for providing said clock output signal.

* * * * *

UNITED STATES PATENT AND TRADEMARK OFFICE
CERTIFICATE OF CORRECTION

PATENT NO. : 5,430,393
DATED : Jul. 4, 1995
INVENTOR(S) : Ravi Shankar et al.

It is certified that error appears in the above-indentified patent and that said Letters Patent is hereby corrected as shown below:

Column 7, line 61, change "dock" to --clock--.

Signed and Sealed this

Twelfth Day of March, 1996

Attest:

BRUCE LEHMAN

*Attesting Officer*  *Commissioner of Patents and Trademarks*